United States Patent
Kojima et al.

(10) Patent No.: US 6,973,136 B2
(45) Date of Patent: Dec. 6, 2005

(54) RADIO COMMUNICATIONS APPARATUS

(75) Inventors: Noriharu Kojima, Yokohama (JP);
Hideki Watanabe, Koza-gun (JP);
Yasunobu Akaoka, Yokosuka (JP);
Junichi Takada, Kamakura (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 895 days.

(21) Appl. No.: 09/893,854

(22) Filed: Jun. 28, 2001

(65) Prior Publication Data
US 2002/0000890 A1    Jan. 3, 2002

(30) Foreign Application Priority Data
Jun. 30, 2000    (JP) .......................... P. 2000-199233

(51) Int. Cl.$^7$ .......................... H04L 23/02; H04L 5/12
(52) U.S. Cl. .................. 375/261; 375/260; 370/20; 455/60
(58) Field of Search .................. 375/298, 297, 375/261, 267, 299; 455/84, 86, 87, 552.1, 455/553.1

(56) References Cited

U.S. PATENT DOCUMENTS 6,438,358 B1 * 8/2002 Higuchi .................. 455/84
6,766,178 B1 * 7/2004 Damgaard et al. ...... 455/552.1

FOREIGN PATENT DOCUMENTS

WO    WO 99/56442    11/1999

OTHER PUBLICATIONS

Patent Abstracts of Japan, Kato Hisakazu, "Modulator", Publication No. 07321857, Publication Date: Dec. 8, 1995, 1 page.
Taizo Yamawaki, Masaru Kokubo, Koyoshi Irie, Hiroaki Matsui, Kazuaki HOri, Takefumi Endou, Hiroshi Hagisawa, Tomio Furuya, Yoshimi Shimizu, Makoto Katagishi and Julian Robert Hildersley, "A 2.7-V GSM RF Transceiver IC", XP-000767457, Dec. 1997, pp. 2089-2096.

* cited by examiner

Primary Examiner—Stephen Chin
Assistant Examiner—Erin M File
(74) Attorney, Agent, or Firm—Pearne & Gordon LLP

(57) ABSTRACT

A phase comparator (106) compares a phase of the output signal of the quadrature modulator (104) with the phase of the signal obtained by frequency-converting the output signal of a first VCO (101) via the second VCO (102) and the first mixer (108). A PLL modulator includes a low-pass filter (107) filters a component below a predetermined frequency of the output signal of the phase comparator (106) and supplying the resulting signal to the frequency control terminal of the first VCO (101). The output signal (TS1) of the first VCO (101) is a modulated signal conforming to a modulation system having a constant envelope waveform, while the output signal of the quadrature modulator (104) is input to the first band-pass filter (110) and the output signal (TS2) of the first band-pass filter is a modulated signal conforming to a modulation system accompanied by an amplitude component as information.

5 Claims, 5 Drawing Sheets

RADIO COMMUNICATIONS APPARATUS

BACKGROUND OF THE INVENTION

The present invention relates to radio communications apparatus supporting two modulation systems, a modulation system having a constant envelope waveform and a modulation system accompanied by an amplitude component as information, and in particular to radio communications apparatus where the circuit scale of a modulator is reduced to assure compact apparatus design and cost reduction.

In recent years, services are getting more and more diversified with the development of mobile communications. This trend has required development of radio communications apparatus (portable terminals) supporting a plurality of communications systems. Among such portable terminals is in need, for example, a dual-mode portable radio terminal supporting two modulation systems, a modulation system having a constant envelope waveform and a modulation system accompanied by an amplitude component as information. The modulation system having a constant envelope waveform is for example the GMSK (Gaussian filtered Minimum Shift Keying). The modulation system accompanied by an amplitude component as information is for example the QPSK (Quadrature Phase-Shift Keying) or CDMA (Code Division Multiple Access).

Figure 6:
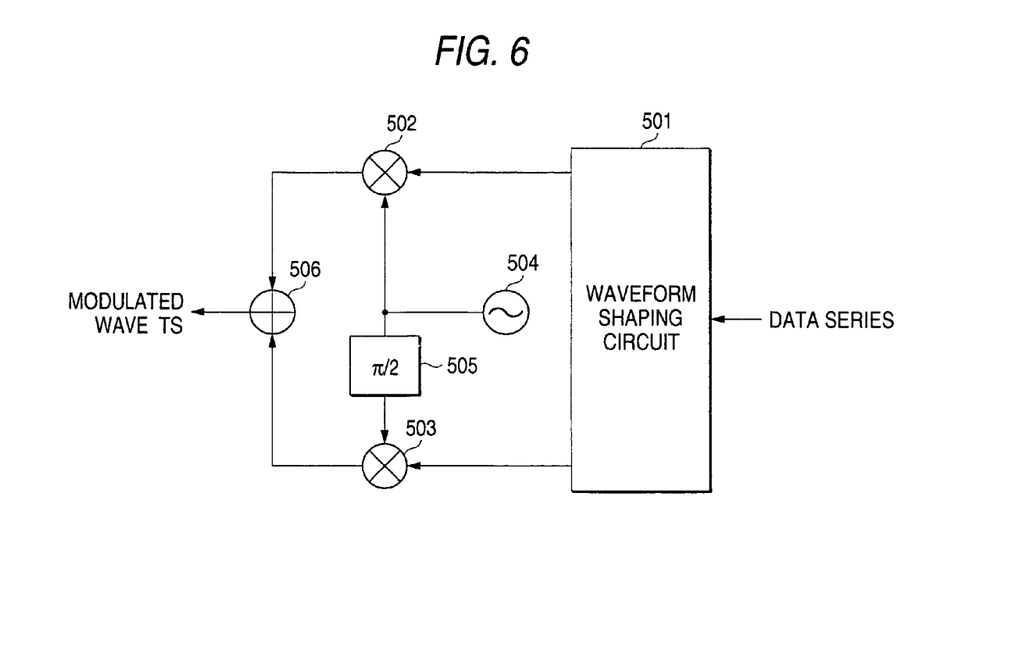
FIG. 6 shows the configuration of a quadrature modulator used in a related art portable radio terminal.

FIG. 6 shows the configuration of a quadrature modulator as an example of a modulator used in a related art portable radio terminal. In the related art quadrature modulator, the input data series is divided into an in-phase component and a quadrature component by a waveform shaping circuit 501. These components pass through a low-pass filter and applied to PSK modulators 502, 503, respectively. PSK modulators 502, 503 receives an output signal from a VCO (voltage-controlled oscillator) 504 for carrier waves and a signal of the same output signal with its phase shifted by $\pi/2$ by a phase shifter 505, respectively. Signals frequency-converted by these PSK modulators 502 and 503 are input to an adder 506 to output a modulated wave TS.

The quadrature modulator in the related art can keep the center frequency and the modulation index with a high degree of precision irrespective of the data series. The quadrature modulator not only supports a modulation system having a constant envelope waveform, for example GMSK, but also accepts a modulation system accompanied by an amplitude component as information, for example QPSK or CDMA. Thus the quadrature modulator is in wide use. However, the quadrature modulator is disadvantageous in that it has a large residual noise in a wideband. As a result, use of the quadrature modulator requires a filter to reduce this noise inserted in a transmitter.

Figure 7:
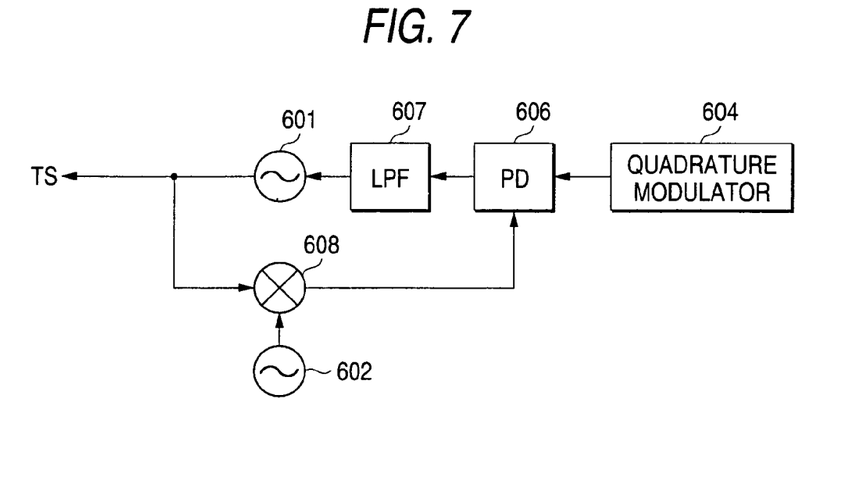
FIG. 7 shows the configuration of a PLL modulator used in a related art portable radio terminal.

FIG. 7 shows the configuration of a PLL (Phase-Locked Loop) modulator as another modulator used in a related art portable radio terminal. The related art PLL modulator inputs the output signal of the aforementioned quadrature modulator 604 to a phase comparator 606 as a modulated wave. The PLL modulator passes a component of phase difference from a signal of the first VCO (first voltage-controlled oscillator) 601 converted to the same frequency through a low-pass filter 607, and inputs the resulting signal to the frequency control terminal of the first VCO 601. In FIG. 7, the numeral 602 designates a second VCO, 608 a first mixer for frequency-converting the output signal of the first VCO based on the output signal of the second VCO.

The related art PLL modulator supports a modulation system having a constant envelope waveform, for example GMSK, but cannot perform a modulation system accompanied by an amplitude component as information, for example QPSK or CDMA. The PLL modulator, however, is in widespread use in a modulation system having a constant envelope waveform such as GMSK, since the out-band noise of the low-pass filter 607 constituting the PLL is substantially determined by the C/N (carrier to noise ratio) so that the residual noise in the wideband is small and it is not necessary to insert a filter in a transmitter.

Figure 8:
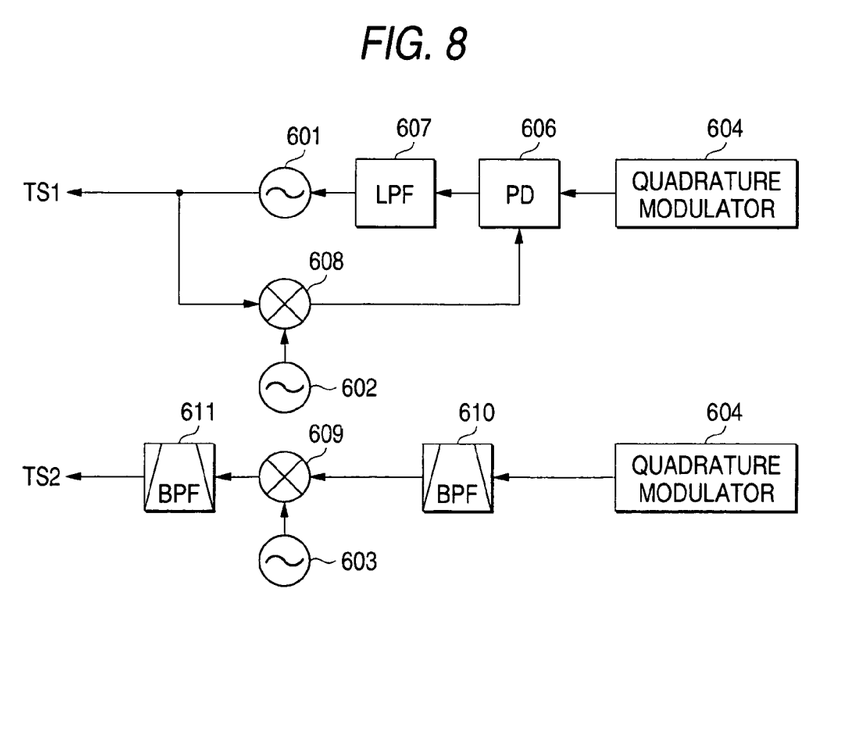
FIG. 8 shows the configuration of a dual-mode portable radio terminal using a quadrature modulator and a PLL modulator according to the related art.

Configuration of a modulator supporting two modulation systems, a modulation system having a constant envelope waveform and a modulation system accompanied by an amplitude component as information may comprise a PLL modulator and a quadrature modulator respectively for these two modulation systems as shown in FIG. 8. The PLL modulator supports the modulation system having a constant envelope waveform while the quadrature modulator supports the modulation system accompanied by an amplitude component as information. Band-pass filters 610, 611 are added to the quadrature modulator 605 in order to reduce noise and a third VCO 603 and a second mixer 609 are added in order to set modulated output (transmission signal TS2) according to the service frequency.

Figure 9:
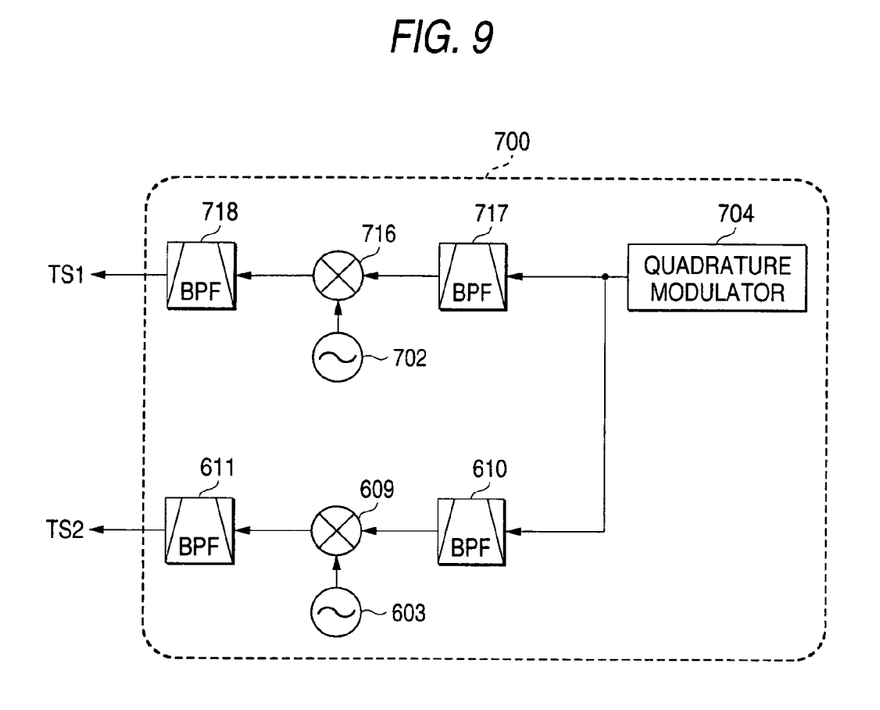
FIG. 9 shows the configuration of a dual-mode portable radio terminal sharing a related art quadrature modulator.

Besides the configuration using a PLL modulator and a quadrature modulator, a configuration is possible where a single quadrature modulator 704 is shared by a modulation system having a constant envelope waveform and a modulation system accompanied by an amplitude component as information in order to generate transmission waves (transmission signals TS1, TS2) via the two modulation systems as shown in FIG. 9. This configuration is based on the fact that the quadrature modulator supports both a modulation system having a constant envelope waveform and a modulation system accompanied by an amplitude component as information.

As mentioned earlier, the two modulation systems have been implemented using dedicated modulators or sharing a quadrature modulator in order to configure a dual-mode portable radio terminal It is clear that the configuration of the related art radio communications apparatus comprising individual modulators in order to support both a modulation system having a constant envelope waveform and a modulation system accompanied by an amplitude component as information still prevents compact apparatus design and cost reduction. In the configuration where a quadrature modulator is shared to implement the two modulation systems, a filter must be inserted in radio communications apparatus that has employed a PLL modulator in case a mixer is used to perform frequency conversion and to generate a transmission wave. This reduces the advantage of sharing a quadrature modulator.

The invention has been proposed in view of the conventional art circumstances and aims at providing radio communications apparatus that supports two modulation systems, a modulation system having a constant envelope waveform and a modulation system accompanied by an amplitude component as information, characterized in that the circuit scale of a modulator is reduced to assure compact apparatus design and cost reduction.

SUMMARY OF THE INVENTION

In order to solve the problem, radio communications apparatus according to the first aspect of the invention comprises a quadrature modulator for composing the transition of the phase of a modulated wave via a in-phase component and a quadrature component, a first voltage-controlled oscillator for outputting a first transmission signal, a first mixer for frequency-converting the first transmission signal based on the output signal of a second voltage-controlled oscillator, a phase comparator for comparing the phase of the output signal of the quadrature modulator with the phase of the output signal of the first mixer, a low-pass filter for filtering the component below a predetermined frequency of the output signal of the phase comparator and supplying the resulting signal to the frequency control terminal of the first voltage-controlled oscillator, and a first band-pass filter for outputting a signal obtained by filtering the component in a predetermined frequency band of the output signal of the quadrature modulator as a second transmission signal.

Radio communications apparatus according to the second aspect of the invention is radio communications apparatus according to the first aspect of the invention, characterized in that the apparatus comprises a second mixer for frequency-converting the output signal of the first band-pass filter based on the output signal of a third voltage-controlled oscillator and a second band-pass filter for outputting a signal obtained by filtering the component in a predetermined frequency band of the output signal of the second mixer as a second transmission signal.

Radio communications apparatus according to the third aspect of the invention is radio communications apparatus according to the second aspect of the invention, characterized in that the second mixer frequency-converts the output signal of the first band-pass filter based on the output signal of the second voltage-controlled oscillator.

Radio communications apparatus according to the fourth aspect of the invention is radio communications apparatus according to the first, second or third aspect of the invention, characterized in that the apparatus comprises a first transmitter for amplifying a first transmission signal output by the first voltage-controlled oscillator and transmitting the resulting signal via an antenna and a second transmitter for amplifying a second transmission signal output by the first band-pass filter or the second band-pass filter and transmitting the resulting signal via an antenna.

According to radio communications apparatus of the first aspect of the invention, in a modulator circuit for comparing, via a phase comparator, the phase of the output signal of a quadrature modulator with the phase of the signal obtained by frequency-converting the output signal of a first voltage-controlled oscillator via a second voltage-controlled oscillator and a first mixer, the modulator circuit using a PLL modulator for filtering, via a low-pass filter, the component below a predetermined frequency of the output signal of the phase comparator and supplying the resulting signal to the frequency control terminal of the first voltage-controlled oscillator, the output signal of the first voltage-controlled oscillator is a modulated signal (first transmission signal) conforming to a modulation system having a constant envelope waveform, for example GMSK, while the output signal of a quadrature modulator is input to the first band-pass filter and the output signal of the first band-pass filter is a modulated signal (second transmission signal) conforming to a modulation system accompanied by an amplitude component as information, for example QPSK or CDMA.

Thus, it is possible to implement dual-mode radio communications apparatus supporting two modulation systems, a modulation system having a constant envelope waveform and a modulation system accompanied by an amplitude component as information, while reducing the circuit scale of a modulator to attain compact apparatus design via reduction of the number of apparatus parts and reduction of apparatus cost via cutback of material cost.

According to radio communications apparatus of the second aspect of the invention, in a modulator circuit using a PLL modulator configured the same as radio communications apparatus according to the first aspect of the invention, the output signal of the first voltage-controlled oscillator is a modulated signal (first transmission signal) conforming to a modulation system having a constant envelope waveform, for example GMSK, while the signal obtained by frequency-converting the output signal of the first band-pass filter via the second mixer based on the output signal of the third voltage-controlled oscillator, and filtering the component in a predetermined frequency band of the output signal of the second mixer via the second band-pass filter is a modulated signal (second transmission signal) conforming to a modulation system accompanied by an amplitude component as information, for example QPSK or CDMA.

Via this configuration, in dual-mode radio communications apparatus supporting two modulation systems, a modulation system having a constant envelope waveform and a modulation system accompanied by an amplitude component as information, it is possible to reduce the circuit scale of a modulator to attain compact apparatus design and cost reduction, as well as set the second transmission signal according to the service frequency.

According to radio communications apparatus of the third aspect of the invention, same as radio communications apparatus according to the second aspect of the invention, in a modulator circuit using a PLL modulator, the output signal of the first voltage-controlled oscillator is a modulated signal (first transmission signal) conforming to a modulation system having a constant envelope waveform, for example GMSK, while in the modulator circuit using a quadrature modulator, the output signal of the second band-pass filter is a modulated signal (second transmission signal) conforming to a modulation system accompanied by an amplitude component as information, for example QPSK or CDMA. In the configuration of radio communications apparatus according to the second aspect of the invention, the second voltage-controlled oscillator and the third voltage-controlled oscillator used for frequency conversion are integrated into a single voltage-controlled oscillator for shared use by adjusting the frequency configuration of transmitter systems so that the second voltage-controlled oscillator and the third voltage-controlled oscillator may be covered by the oscillation frequency range of a single voltage-controlled oscillator. Via this configuration, it is possible to reduce the circuit scale of a modulator to attain compact apparatus design via reduction of the number of apparatus parts and reduction of apparatus cost via cutback of material cost.

Further, according to radio communications apparatus of the fourth aspect of the invention, in radio communications apparatus according to the first, second and third aspects of the invention, the output signal of a modulator circuit using a PLL modulator is amplified by a first transmitter and transmitted via an antenna, and the output signal of a modulator circuit using a quadrature modulator is amplified by a second transmitter and transmitted via the antenna. Via this configuration, it is possible to reduce the circuit scale of radio communications apparatus equipped with a dual-mode modulator for performing modulation conforming to a modulation system having a constant envelope waveform, for example GMSK, and a modulation system accompanied by an amplitude component as information, for example QPSK or CDMA, thereby attaining compact apparatus design via reduction of the number of apparatus parts and cutback of material cost.

DETAILED DESCRIPTION OF THE PREFERRED EMBODIMENT

Embodiments of radio communications apparatus of the invention will be detailed referring to drawings in the order of (First embodiment), (Second embodiment), (Third embodiment), and (Fourth embodiment).

(First Embodiment)

Figure 1:
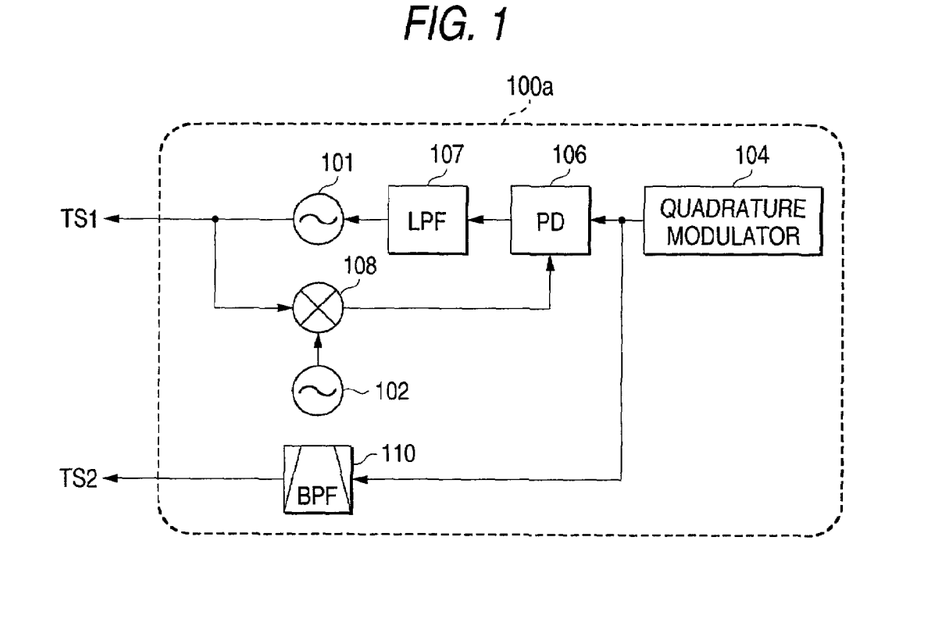
FIG. 1 shows the configuration of a dual mode modulator 100a of radio communications apparatus according to the first embodiment of the invention.

FIG. 1 shows the configuration of a dual mode modulator 100a of radio communications apparatus according to the first embodiment of the invention. The radio communications apparatus of the embodiment comprises a quadrature modulator and a PLL modulator that have been integrated.

As shown in FIG. 1, the dual-mode modulator 100 of the embodiment comprises a quadrature modulator 104 for composing the transition of the phase of a modulated wave via a in-phase component and a quadrature component, a first voltage-controlled oscillator (first VCO) 101 for outputting a first transmission signal TS1, a second voltage-controlled oscillator (second VCO) 102, a first mixer 108 for frequency-converting the first transmission signal TS1 based on the output signal of the second VCO 102, a phase comparator (PD) for comparing the phase of the output signal of the quadrature modulator with the phase of the output signal of the first mixer 108, a low-pass filter (LPF) 107 for filtering the component below a predetermined frequency of the output signal of the phase comparator 106 and supplying the resulting signal to the frequency control terminal of the first VCO 101, and a first band-pass filter (BPF) for outputting a signal obtained by filtering the component in a predetermined frequency band of the output signal of the quadrature modulator 104 as a second transmission signal TS2.

First, the output of the quadrature modulator 104 is input to the phase comparator 106. A signal obtained by passing the output of the phase comparator 106 through the low-pass filter 107 is input to the first VCO 101. The output signal of the first VCO is branched to the first transmission signal TS1 and the input signal of the first mixer 108. A signal obtained by frequency conversion via the first mixer 108 and the second VCO 102 is input to the phase comparator 106 together with the output signal of the quadrature modulator 104. As a result, a modulated signal having a constant envelope waveform, for example a GMSK modulated wave is generated as the first transmission signal TS1.

On the other hand, the output of the quadrature modulator 104 undergoes filtering of the component in a predetermined frequency band via the band-pass filter 110 and is output as the second transmission signal TS2. As a result, a modulated signal confirming to a modulation system modulation system accompanied by an amplitude component as information, for example QPSK or CDMA is generated, as well as a modulated wave conforming to a modulation system having a constant envelope waveform.

While a modulator in radio communications apparatus according to the invention requires a PLL modulator, the phase comparator 106 is comprised in a PLL can be easily integrated. Thus, referring to the related art shown in FIG. 9, the related art configuration shares a quadrature modulator 704 and at the same time a band-pass filters 717 and 718 must be inserted in the transmitter. Meanwhile, according to radio communications apparatus of the embodiment, it is possible to attain compact apparatus design via reduction of the number of larger parts and cutback of material cost.

The radio communications apparatus in the embodiment includes a modulator circuit employing th PLL modulator wherein the phase comparator 106 compares the phase of the output signal of the quadrature modulator 104 with the phase of the signal obtained by frequency-converting the output signal of the first VCO 101 via the second VCO 102 and the first mixer 108, and wherein the low-pass filter 107 filters the component below a predetermined frequency of the output signal of the phase comparator 106 and supplies the resulting signal to the frequency control terminal of the first VCO 101. In the modulator circuit, the output signal (transmission signal TS1) of the first VCO 101 is a modulated signal conforming to a modulation system having a constant envelope waveform, for example GMSK, while the output signal of the quadrature modulator 104 is input to the first band-pass filter 110 and the output signal (transmission signal TS2) of the first band-pass filter is a modulated signal conforming to a modulation system accompanied by an amplitude component as information, for example QPSK or CDMA. Thus, it is possible to implement dual-mode radio communications apparatus while reducing the circuit scale of a modulator to attain compact apparatus design via reduction of the number of apparatus parts and reduction of apparatus cost via cutback of material cost.

(Second Embodiment)

Figure 2:
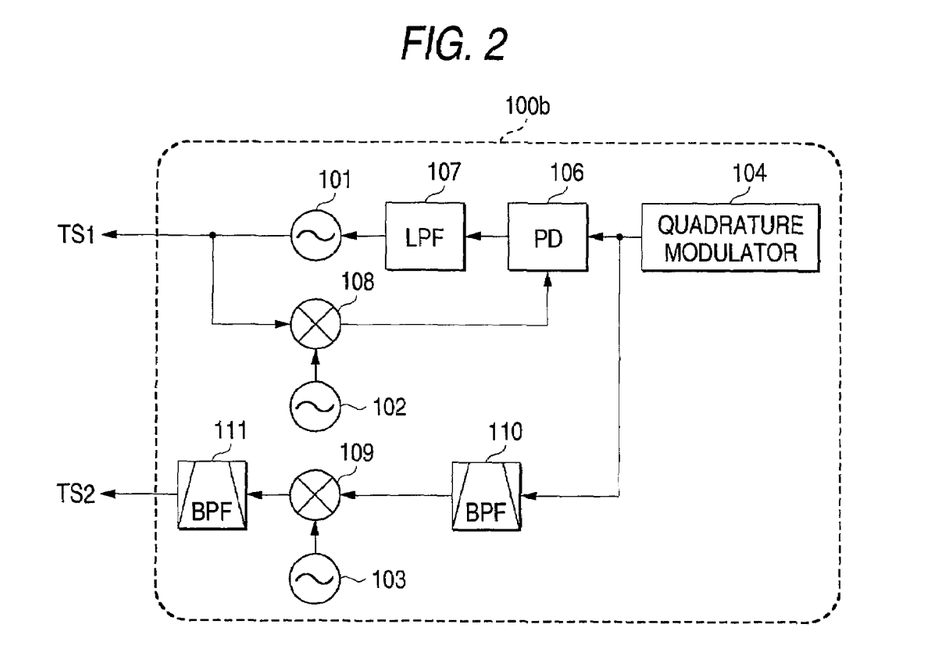
FIG. 2 shows the configuration of a dual-mode modulator 100b of radio communications apparatus according to the second embodiment of the invention.

FIG. 2 shows the configuration of a dual-mode modulator 100b of radio communications apparatus according to the second embodiment of the invention. Radio communications apparatus according to the embodiment comprises, same as the radio communications apparatus according to the first embodiment, a quadrature modulator and a PLL modulator that have been integrated with a mixer and a band-pass filter added to the modulator circuit of a quadrature modulation system.

As shown in FIG. 2, the dual-mode modulator 100b of the embodiment, same as the dual-mode modulator 100a of the first embodiment, comprises a quadrature modulator 104, a first voltage-controlled oscillator (first VCO) 101, a second voltage-controlled oscillator (second VCO) 102, a first mixer 108, a phase comparator (PD) 106, a low-pass filter (LPF) 107 and a first band-pass filter (BPF) 110. The dual-mode modulator 100*b* further comprises a third voltage-controlled oscillator (third VCO) 103, a second mixer 109 for frequency-converting the output signal of the first band-pass filter 110 based on the output signal of the third VCO 103 and a second band-pass filter (BPF) 111 for outputting a signal obtained by filtering the component in a predetermined frequency band of the output signal of the second mixer 109.

According to radio communications apparatus of the embodiment, in a modulator circuit using a PLL modulator configured the same as radio communications apparatus according to the first aspect of the invention, the output signal (transmission signal TS1) of the first VCO 101 is a modulated signal conforming to a modulation system having a constant envelope waveform, for example GMSK, while the signal obtained by frequency-converting the output signal of the first band-pass filter 110 via the second mixer based on the output signal of the third VCO 103, and filtering the component in a predetermined frequency band of the output signal of the second mixer 109 via the second band-pass filter 111 is a modulated signal conforming to a modulation system accompanied by an amplitude component as information, for example QPSK or CDMA.

Thus, in dual-mode radio communications apparatus supporting two modulation systems, a modulation system having a constant envelope waveform and a modulation system accompanied by an amplitude component as information, it is possible to reduce the circuit scale of a modulator to attain compact apparatus design and cost reduction, as well as set the second transmission signal TS2 according to the service frequency.

(Third Embodiment)

Figure 3:
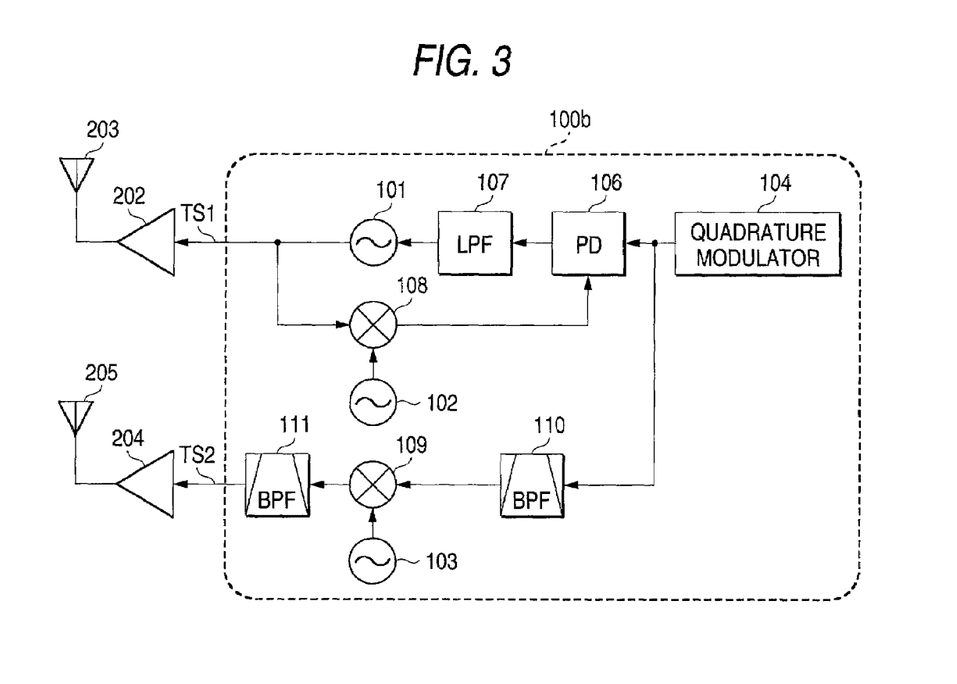
FIG. 3 shows the configuration of radio communications apparatus according to the third embodiment of the invention.

FIG. 3 shows the configuration of radio communications apparatus according to the third embodiment of the invention. Radio communications apparatus according to the embodiment configures the transmission system of the radio communications apparatus by using the dual-mode modulator 100*b* according to the second embodiment.

As shown in FIG. 3, radio communications apparatus of the embodiment comprises a dual-mode modulator 100*b* according to the second embodiment, a first antenna 203, a first power amplifier (first transmitter) 202 for amplifying the first transmission signal TS1 output by the first VCO 101 and transmitting the resulting signal via the first antenna 203, a second antenna 205, and a second power amplifier (second transmitter) 204 for amplifying the second transmission signal TS2 output by the second band-pass filter 111 and transmitting the resulting signal via the second antenna 205.

According to radio communications apparatus of the embodiment, it is possible to configure dual-mode radio communications apparatus comprising a first system where the first transmission signal TS1 is amplified by the first power amplifier 202 and transmitted from the first antenna 203 and a second system where the second transmission signal TS2 is amplified by the second power amplifier 204 and transmitted from the second antenna 205. Further, by switching between the oscillating frequencies of the first VCO 101, second VCO 102 and third VCO 103, it is possible to configure compact radio communications apparatus supporting a plurality of frequency bands and a plurality of modes.

(Fourth Embodiment)

Figure 4:
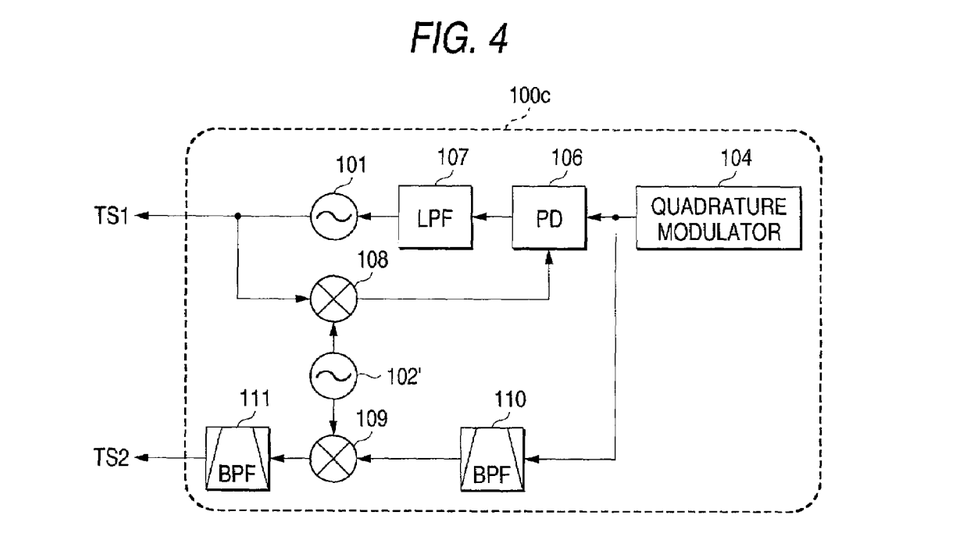
FIG. 4 shows the configuration of a dual-mode modulator 100c of radio communications apparatus according to the fourth embodiment of the invention.

FIG. 4 shows the configuration of a dual-mode modulator 100*c* of radio communications apparatus according to the fourth embodiment of the invention. Radio communications apparatus according to the embodiment comprises, same as the radio communications apparatus according to the first and second embodiments, a quadrature modulator and a PLL modulator that have been integrated and the second VCO 102 and the third VCO 103 in the radio communications apparatus according to the second embodiment that have been integrated into a single VCO.

As shown in FIG. 4, the dual-mode modulator 100*c* of the embodiment, same as the dual-mode modulator 100*a* of the first embodiment, comprises a quadrature modulator 104, a first voltage-controlled oscillator (first VCO) 101, a second voltage-controlled oscillator (second VCO) 102', a first mixer 108, a phase comparator (PD) 106, a low-pass filter (LPF) 107 and a first band-pass filter (BPF) 110. The dual-mode modulator 100*c* also comprises a second mixer 109 for frequency-converting the output signal of the first band-pass filter 110 based on the output signal of the second VCO 102' and a second band-pass filter (BPF) 111 for outputting a signal obtained by filtering the component in a predetermined frequency band of the output signal of the second mixer 109.

According to radio communications apparatus of the embodiment, by adjusting the frequency configuration in each transmitter system so that the oscillating frequencies of the second VCO 102 and the third VCO 103 in radio communications apparatus according to the second embodiment may be covered by the oscillation frequency range of a single VCO 102', the second VCO 102 and the third VCO 103 used for frequency conversion are integrated for shared use. Via this configuration, it is possible to reduce the number of VCOs and further attaining compact design of a modulator circuit.

(Fifth Embodiment)

Figure 5:
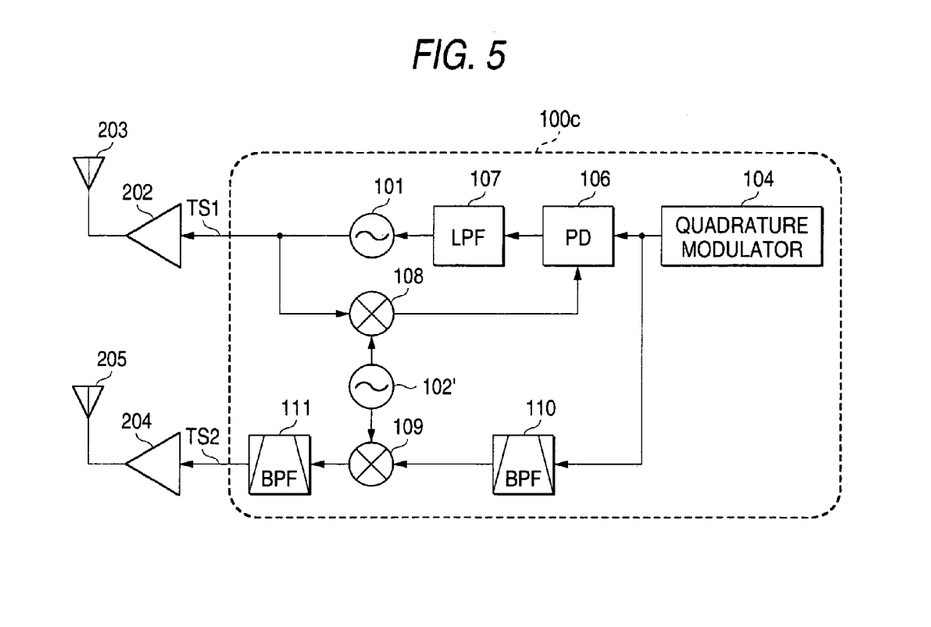
FIG. 5 shows the configuration of radio communications apparatus according to the fifth embodiment of the invention.

FIG. 5 shows the configuration of radio communications apparatus according to the fifth embodiment of the invention. Radio communications apparatus according to the embodiment configures the transmission system of the radio communications apparatus by using the dual-mode modulator 100*c* according to the fourth embodiment.

As shown in FIG. 5, radio communications apparatus of the embodiment comprises a dual-mode modulator 100*c* according to the fourth embodiment, a first antenna 203, a first power amplifier (first transmitter) 202 for amplifying the first transmission signal TS1 output by the first VCO 101 and transmitting the resulting signal via the first antenna 203, a second antenna 205, and a second power amplifier (second transmitter) 204 for amplifying the second transmission signal TS2 output by the second band-pass filter 111 and transmitting the resulting signal via the second antenna 205.

According to radio communications apparatus of the embodiment, it is possible to configure dual-mode radio communications apparatus comprising a first system where the first transmission signal TS1 is amplified by the first power amplifier 202 and transmitted from the first antenna 203 and a second system where the second transmission signal TS2 is amplified by the second power amplifier 204 and transmitted from the second antenna 205. Further, by switching between the oscillating frequencies of the first VCO 101, second VCO 102 and third VCO 103, it is possible to configure compact radio communications apparatus supporting a plurality of frequency bands and a plurality of modes.

As mentioned earlier, the radio communications apparatus in the embodiment includes a modulator circuit employing th PLL modulator wherein the phase comparator 106 compares the phase of the output signal of the quadrature modulator 104 with the phase of the signal obtained by frequency-converting the output signal of the first VCO 101 via the second VCO 102 and the first mixer 108, and wherein the low-pass filter 107 filters the component below a predetermined frequency of the output signal of the phase comparator 106 and supplies the resulting signal to the frequency control terminal of the first VCO 101. In the modulator circuit, the output signal of the first voltage-controlled oscillator is a modulated signal (first transmission signal) conforming to a modulation system having a constant envelope waveform, while the output signal of a quadrature modulator is input to the first band-pass filter and the output signal of the first band-pass filter is a modulated signal (second transmission signal) conforming to a modulation system accompanied by an amplitude component as information. Thus it is possible to implement dual-mode radio communications apparatus while reducing the circuit scale of a modulator to attain compact apparatus design via reduction of the number of apparatus parts and reduction of apparatus cost via cutback of material cost.

According to radio communications apparatus of the invention, in a modulator circuit using the aforementioned PLL modulator, the output signal of the first voltage-controlled oscillator is a modulated signal (first transmission signal) conforming to a modulation system having a constant envelope waveform, while the signal obtained by frequency-converting the output signal of the first band-pass filter via the second mixer based on the output signal of the third voltage-controlled oscillator, and filtering the component in a predetermined frequency band of the output signal of the second mixer via the second band-pass filter is a modulated signal (second transmission signal) conforming to a modulation system accompanied by an amplitude component as information. Thus, in dual-mode radio communications apparatus supporting two modulation systems, a modulation system having a constant envelope waveform and a modulation system accompanied by an amplitude component as information, it is possible to reduce the circuit scale of a modulator to attain compact apparatus design and cost reduction, as well as set the second transmission signal according to the service frequency.

According to radio communications apparatus of the invention, by adjusting the frequency configuration of transmitter systems so that the second voltage-controlled oscillator and the third voltage-controlled oscillator may be covered by the oscillation frequency range of a single voltage-controlled oscillator and integrating the second voltage-controlled oscillator and the third voltage-controlled oscillator used for frequency conversion into a single voltage-controlled oscillator for shared use, it is possible to reduce the circuit scale of a modulator to attain compact apparatus design via reduction of the number of apparatus parts and reduction of apparatus cost via cutback of material cost.

Further, according to radio communications apparatus of the invention, the output signal of a modulator circuit using a PLL modulator is amplified by a first transmitter and transmitted via an antenna, and the output signal of a modulator circuit using a quadrature modulator is amplified by a second transmitter and transmitted via the antenna.

Thus, it is possible to reduce the circuit scale of radio communications apparatus equipped with a dual-mode modulator for performing modulation conforming to a modulation system having a constant envelope waveform, and a modulation system accompanied by an amplitude component as information, thereby attaining compact apparatus design via reduction of the number of apparatus parts and cutback of material cost.

What is claimed is:

1. Radio communications apparatus comprising:
 a quadrature modulator for making the transition of the phase of a modulated wave via a in-phase component and a quadrature component;
 a first voltage-controlled oscillator for outputting a first transmission signal;
 a second voltage-controlled oscillator;
 a first mixer for frequency-converting the first transmission signal based on the output signal of the second voltage-controlled oscillator;
 a phase comparator for comparing the phase of the output signal of the quadrature modulator with the phase of the output signal of the first mixer;
 a low-pass filter for filtering the component below a predetermined frequency of the output signal of the phase comparator and supplying the resulting signal to the frequency control terminal of the first voltage-controlled oscillator;
 a first band-pass filter for outputting a signal obtained by filtering the component in a predetermined frequency band of the output signal of the quadrature modulator as a second transmission signal;
 a first transmitter for amplifying the first transmission signal and transmitting the resulting signal via a first antenna; and
 a second transmitter for amplifying the second transmission signal and transmitting the resulting signal via a second antenna.

2. Radio communications apparatus comprising:
 a quadrature modulator for making the transition of the phase of a modulated wave via a in-phase component and a quadrature component;
 a first voltage-controlled oscillator for outputting a first transmission signal;
 a second voltage-controlled oscillator;
 a first mixer for frequency-converting the first transmission signal based on the output signal of the second voltage-controlled oscillator;
 a phase comparator for comparing the phase of the output signal of the quadrature modulator with the phase of the output signal of the first mixer;
 a low-pass filter for filtering the component below a predetermined frequency of the output signal of the phase comparator and supplying the resulting signal to the frequency control terminal of the first voltage-controlled oscillator;
 a first band-pass filter for outputting a signal obtained by filtering the component in a predetermined frequency band of the output signal of the quadrature modulator;
 a third voltage-controlled oscillator;
 a second mixer for frequency-converting the output signal of the first band-pass filter based on the output signal of the third voltage-controlled oscillator; and
 a second band-pass filter for outputting a signal obtained by filtering the component in a predetermined frequency band of the output signal of the second mixer as a second transmission signal.

3. Radio communications apparatus comprising:
a quadrature modulator for making the transition of the phase of a modulated wave via a in-phase component and a quadrature component;
a first voltage-controlled oscillator for outputting a first transmission signal;
a second voltage-controlled oscillator;
a first mixer for frequency-converting the first transmission signal based on the output signal of the second voltage-controlled oscillator;
a phase comparator for comparing the phase of the output signal of the quadrature modulator with the phase of the output signal of the first mixer;
a low-pass filter for filtering the component below a predetermined frequency of the output signal of the phase comparator and supplying the resulting signal to the frequency control terminal of the first voltage-controlled oscillator;
a first band-pass filter for outputting a signal obtained by filtering the component in a predetermined frequency band of the output signal of the quadrature modulator;
a second mixer for frequency-converting the output signal of said first band-pass filter based on the output signal of the second voltage-controlled oscillator; and
a second band-pass filter for outputting a signal obtained by filtering the component in a predetermined frequency band of the output signal of the second mixer as a second transmission signal.

4. Radio communications apparatus according to claim 2, further comprising:
a first transmitter for amplifying a first transmission signal output from the first voltage-controlled oscillator and transmitting the resulting signal via an antenna; and
a second transmitter for amplifying a second transmission signal output from the second band-pass filter and transmitting the resulting signal via an antenna.

5. Radio communications apparatus according to claim 3, further comprising:
a first transmitter for amplifying a first transmission signal output from the first voltage-controlled oscillator and transmitting the resulting signal via an antenna; and
a second transmitter for amplifying a second transmission signal output from the second band-pass filter and transmitting the resulting signal via an antenna.

* * * * *

UNITED STATES PATENT AND TRADEMARK OFFICE
CERTIFICATE OF CORRECTION

PATENT NO.        : 6,973,136 B2                                   Page 1 of 1
APPLICATION NO.   : 09/893854
DATED             : December 6, 2005
INVENTOR(S)       : Kojima et al.

It is certified that error appears in the above-identified patent and that said Letters Patent is hereby corrected as shown below:

On the Title Page

Item (56), FOREIGN PATENT DOCUMENTS, please insert the following reference -- WO    99/52221    10/1999 --.

Signed and Sealed this

Second Day of June, 2009

JOHN DOLL
*Acting Director of the United States Patent and Trademark Office*